US012692592B2

(12) United States Patent
Subramani et al.

(10) Patent No.: US 12,692,592 B2
(45) Date of Patent: Jul. 28, 2026

(54) ROTARY ELECTRICAL FEEDTHROUGH INTEGRATION FOR PROCESS CHAMBER

(71) Applicant: Applied Materials, Inc., Santa Clara, CA (US)

(72) Inventors: Anantha Subramani, San Jose, CA (US); Yang Guo, Fremont, CA (US); John Forster, Santa Clara, CA (US); Wade Harrelson, Santa Clara, CA (US); Andrew Tomko, Sunnyvale, CA (US); Anthony Chan, Santa Clara, CA (US); Sathya Swaroop Ganta, Sunnyvale, CA (US); Mike Murtagh, Santa Clara, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 924 days.

(21) Appl. No.: 17/865,255

(22) Filed: Jul. 14, 2022

(65) Prior Publication Data

US 2024/0018646 A1    Jan. 18, 2024

(51) Int. Cl.
    *C23C 14/50*       (2006.01)
    *H10P 72/72*       (2026.01)
    *H10P 72/76*       (2026.01)
(52) U.S. Cl.
    CPC .......... *C23C 14/505* (2013.01); *H10P 72/722* (2026.01); *H10P 72/7624* (2026.01)
(58) Field of Classification Search
    CPC ......................... C23C 14/505; H01L 21/6833
    See application file for complete search history.

(56) References Cited

U.S. PATENT DOCUMENTS

| | | | |
|---|---|---|---|
| 5,270,600 | A | 12/1993 | Hashimoto |
| 6,232,047 | B1 | 5/2001 | Frye et al. |
| 6,500,266 | B1 | 12/2002 | Ho et al. |
| 7,321,182 | B2 | 1/2008 | Kataoka |
| 11,174,552 | B2 | 11/2021 | Neikirk et al. |
| 11,183,375 | B2 | 11/2021 | Subramani et al. |
| 2005/0048781 | A1 | 3/2005 | Langley et al. |

(Continued)

FOREIGN PATENT DOCUMENTS

| | | |
|---|---|---|
| JP | 2005332889 A | 12/2005 |
| JP | 2017502489 A | 1/2017 |

(Continued)

OTHER PUBLICATIONS

International Search Report and Written Opinion from PCT/US2023/025316 dated Oct. 16, 2023, 10 pgs.

(Continued)

*Primary Examiner* — Seahee Hong
(74) *Attorney, Agent, or Firm* — Schwabe, Williamson & Wyatt, P.C.

(57) ABSTRACT

Embodiments disclosed herein include semiconductor processing tools. In an embodiment, the semiconductor processing tool comprises a chamber, a chuck within the chamber, where the chuck is configured to rotate, a pedestal holder around the chuck, and a utility column coupled to the chuck. In an embodiment, the utility column comprises a magnetic coupler to enable rotation of portions of the utility column and the chuck, and a rotary electrical feedthrough.

8 Claims, 6 Drawing Sheets

(56)           References Cited

U.S. PATENT DOCUMENTS

| | | | |
|---|---|---|---|
| 2012/0108080 A1 | 5/2012 | Akao et al. | |
| 2014/0263275 A1 | 9/2014 | Nguyen et al. | |
| 2015/0075431 A1 | 3/2015 | Barriss et al. | |
| 2018/0174880 A1* | 6/2018 | Swaminathan | H10P 72/72 |
| 2019/0181028 A1* | 6/2019 | Patel | C23C 14/505 |
| 2023/0130947 A1* | 4/2023 | Penmethsa | H01J 37/3408 |
| | | | 204/192.12 |

FOREIGN PATENT DOCUMENTS

| | | |
|---|---|---|
| JP | 2017143057 A | 8/2017 |
| JP | 2019503066 A | 1/2019 |
| JP | 2020524398 A | 8/2020 |
| KR | 20190088078 A | 7/2019 |
| KR | 20200088500 A | 7/2020 |
| TW | 200916509 A | 4/2009 |

OTHER PUBLICATIONS

Notice of Preliminary Rejection from Korean Patent Application No. 10-2025-7004920 mailed Aug. 13, 2025, 1 pg.

Official Letter from Taiwan Patent Application No. 112124887 dated Jul. 25, 2025, 8 pgs.

International Preliminary Report on Patentability from PCT/US2023/025316 mailed Jan. 23, 2025, 7 pages.

Notice of Reasons for Rejection from Japanese Patent Application No. 2025-500802 dated Feb. 10, 2026, 7 pgs.

Official Letter from Taiwan Patent Application No. 112124887 dated Apr. 30, 2026, 5 pgs.

* cited by examiner

ROTARY ELECTRICAL FEEDTHROUGH INTEGRATION FOR PROCESS CHAMBER

BACKGROUND

1) Field

Embodiments relate to the field of semiconductor manufacturing and, in particular, to semiconductor processing tools with rotary electrical feedthroughs to enable rotating substrates within the semiconductor processing tools.

2) Description of Related Art

In semiconductor manufacturing processes, process uniformity is a key metric. In the case of deposition processes, such as physical vapor deposition (PVD) processes, the uniformity metric of interest is thickness uniformity of the deposited film. Currently, there are many different process control variables that can be adjusted in order to try and improve the thickness uniformity. Unfortunately, such controls (e.g., RF power, gas flow rates, temperature, etc.) on a stationary wafer do not provide the necessary improvement needed for advanced processing operations.

Accordingly, it may be desirable to introduce a rotational component to the semiconductor processing tool. Rotating the substrate (e.g., wafer) can result in the averaging out of thickness variations in order to provide a more uniform thickness value across the surface of the substrate. However, adding rotation to semiconductor processing tools is not without issue. For example, existing chucking architectures may require the use of electrical inputs. As such, a way to rotate the electrical inputs is needed. Additionally, providing the rotational force to the chuck may result in architectures that are not capable of maintaining high vacuum conditions (e.g. $1e^{-9}$ Torr or lower).

SUMMARY

Embodiments disclosed herein include semiconductor processing tools. In an embodiment, the semiconductor processing tool comprises a chamber, a chuck within the chamber, where the chuck is configured to rotate, a pedestal holder around the chuck, and a utility column coupled to the chuck. In an embodiment, the utility column comprises a magnetic coupler to enable rotation of portions of the utility column and the chuck, and a rotary electrical feedthrough.

Embodiments disclosed herein include rotary electrical feedthroughs. In an embodiment, the rotary electrical feedthrough comprises a stator housing, an electrical transfer assembly within the stator housing, a first insulator between the electrical transfer assembly and the stator housing, a rotor electrically coupled to the electrical transfer assembly, mechanical bearings between the rotor and the stator housing, and a second insulator between the mechanical bearings and the stator housing.

Embodiments disclosed herein include a magnetic coupler to enable contactless rotation. In an embodiment, the magnetic coupler comprises a tube, a bushing around the tube, a housing outside of the bushing, a first set of magnets between the tube and the bushing, a second set of magnets between the bushing and the housing, first bearings between the tube and the bushing, wherein the first bearings are electrically insulating, and second bearings between the bushing and the housing.

DETAILED DESCRIPTION

Systems described herein include semiconductor processing tools with rotary electrical feedthroughs to enable rotating substrates within the semiconductor processing tools. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, it is desirable to provide rotational motion to substrates in a semiconductor processing tool. The rotational motion enables improved parameter uniformity, such as thickness uniformity. However, existing rotational architectures are limited in that they may not provide adequate vacuum pressure environments and accommodation for utilities (e.g., electrical paths and gas paths) that need to be connected to the chuck.

Accordingly, embodiments disclosed herein include semiconductor processing tools with advanced rotational components. In one instance, embodiments include a magnetic coupling portion that enables rotation outside of the vacuum environment to be transferred to components within the vacuum environment. As such, low pressure environments may be maintained. Additionally, embodiments include rotary electric feedthroughs that enable the utilities to the chuck to rotate freely. For example, up to seven or more electrical paths may be provided through the rotary electrical feedthrough in some embodiments.

Additionally, embodiments disclosed herein enable a highly efficient RF return path. This enables closed-loop control of the plasma circuit, and this return path provides a connection between the chamber grounding shield and the inner grounding surface of feedthrough connectors, and eventually to the RF match/power supply in atmosphere to fulfill the circuit loop. Particularly, the RF return path is electrically isolated from other conductive components (e.g., using insulating layers, insulating bearings, and the like) in order to improve the efficiency of the RF return path.

Figure 1:
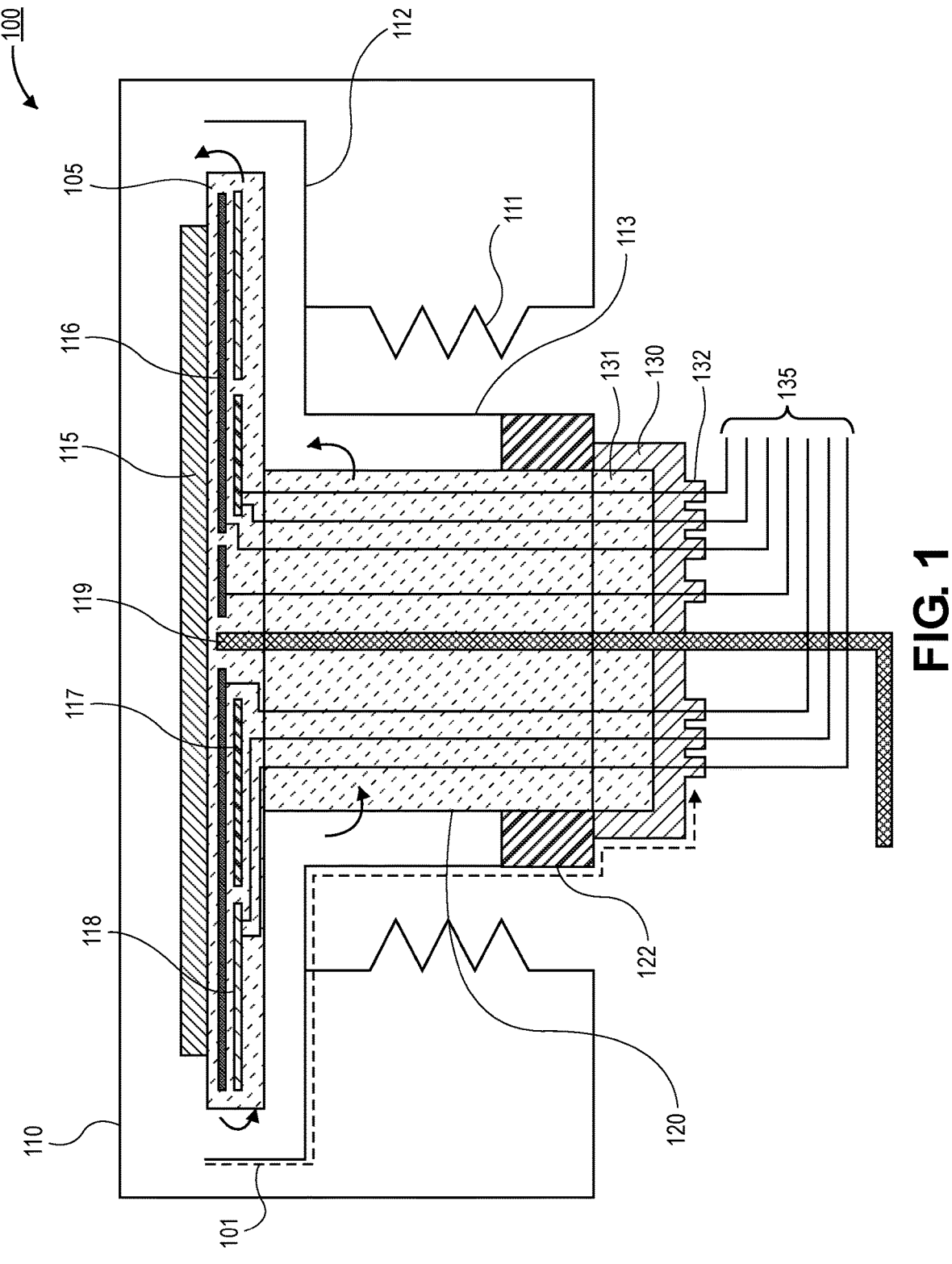
FIG. 1 is a schematic of a semiconductor processing tool that includes a utility column that is rotatable, in accordance with an embodiment.

Referring now to FIG. 1, a schematic illustration of a semiconductor processing tool 100 is shown, in accordance with an embodiment. The semiconductor processing tool 100 may be any type of tool useful in semiconductor manufacturing processes. For example, the semiconductor processing tool 100 may be a deposition tool (e.g., a chemical vapor deposition (CVD) tool, a physical vapor deposition (PVD) tool, an atomic layer deposition (ALD) tool, or the like), or an etching tool. The semiconductor processing tool 100 may include a chamber 110. The chamber 110 is shown as a single structure for simplicity in FIG. 1, but it is to be appreciated that the chamber 110 may include any number of discrete components. In an embodiment, a baffle 111 may be used in order to allow for vertical displacement of chuck 105.

In an embodiment, the chuck 105 may support a substrate 115. The substrate 115 may be any suitable substrate, such as a silicon wafer or other semiconductor wafers. Though, substrates 115 formed with other materials (e.g., glass, ceramic, etc.) may also be processed in the semiconductor processing tool 100. The substrate 115 may have any suitable form factor (e.g., 300 mm wafers, 450 mm wafers, any other standard wafer form factor, or any non-wafer form factor).

In an embodiment, the chuck 105 may include heaters 117 and 118. The heaters may be separated into an inner heater 117 and an outer heater 118. The chuck 105 may also be an electrostatic chuck (ESC). In such embodiments, the chuck 105 may include features for applying an electrostatic force to the substrate 115. For example, electrodes 116 may be provided in the chuck 105. The electrodes 116 may include a left side electrode, a right side electrode, and a center tap. In an embodiment, the electrical connections 135 for the heaters 117 and 118 and the electrodes 116 may be provided through a utility column 113. The electrical paths 135 may include connections for RF power, AC power, and/or DC power.

The ends of the electrical connections 135 may be provided at the inputs 132 of a rotary electrical feedthrough 130. The rotary electrical feedthrough 130 takes stationary electrical inputs 132 and routes them to a rotor 131 that is capable of rotating. As shown in FIG. 1, the chuck 105, the magnetic coupler 120 and the rotor 131 are all shown with the same shading in order to indicate that they are part of the rotational system of the semiconductor processing tool 100. The rotational force may be supplied by a magnetic system 122. The rotational system is described in greater detail below.

In an embodiment, a backside gas conduit 119 is also provided through the utility column 113 and the rotary electrical feedthrough 130. For example, a dynamic seal (not shown) to allow for rotation around the backside gas conduit 119 may be provided at the bottom of the rotary electrical feedthrough 130. The backside gas conduit 119 may be axially centered with the utility column 113. This allows for the chuck 105, the magnetic coupler 120, and the rotary electrical feedthrough 130 to freely rotate around a stationary backside gas conduit 119.

In an embodiment, the structure of the semiconductor processing tool 100 may further comprise an RF return path 101. The RF return 101 path allows for closed-loop control of the plasma circuit. In a particular embodiment, the RF return path 101 is provided along stationary conductive features in the utility column 113 and the rotary electrical feedthrough 130. For example, the RF return path 101 may begin at a stationary pedestal holder 112. The pedestal holder 112 may be coupled to a chamber grounding shield (not shown) with a conductive strap. The conductive strap is flexible in order to enable the electrical connection to be maintained when the vertical position of the chuck 105 is changed within the chamber 100. In an embodiment, the pedestal holder 112 may be electrically coupled to the utility column 113. As such, the RF return path 101 may pass along a stationary portion of the utility column 113 until reaching the rotary electrical feedthrough 130. The RF return path 101 continues on a stationary outer housing of the rotary electrical feedthrough 130. As will be described in greater detail below, the RF return path 101 may be electrically isolated from other conductive features of the semiconductor processing tool 100. As such, there is minimal interference with the RF return path 101.

It is also to be appreciated that the rotational mechanism (namely, magnetic rotation) allows for high vacuum conditions. Particularly, the magnetic coupler and the rotary electrical feedthrough 130 may include internal volumes that remain at or below the vacuum pressure within the chamber 110. In a particular embodiment, the pressure in the rotary electrical feedthrough 130 is decreased in order to push the conditions to the far left of the Paschen curve in order to prevent the ignition of plasma within the rotary electrical feedthrough 130.

Figure 2:
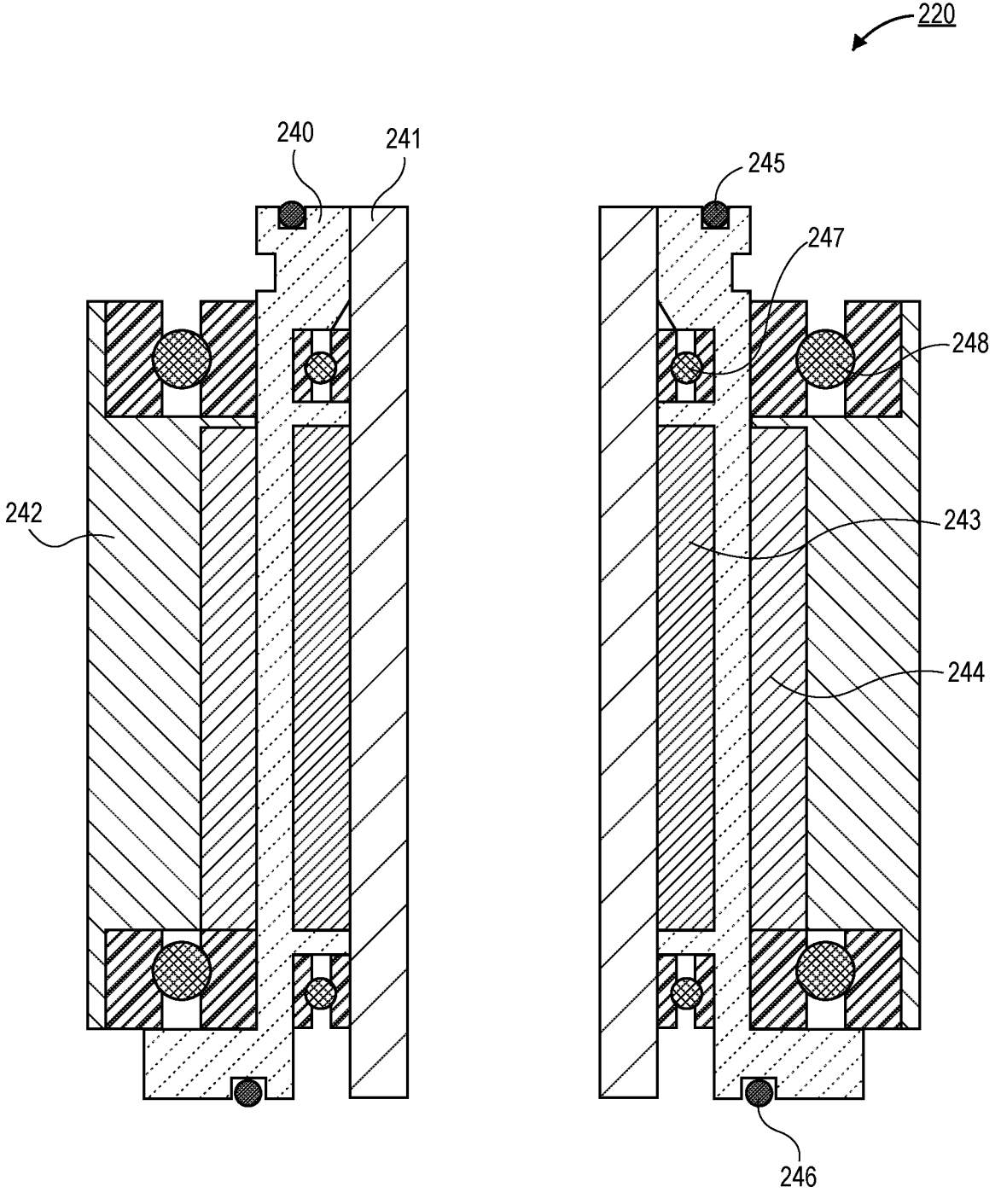
FIG. 2 is a cross-sectional illustration of a magnetic coupler architecture that can be used to rotate the chuck in a semiconductor processing tool, in accordance with an embodiment.

Referring now to FIG. 2, a cross-sectional illustration of the magnetic coupler 220 is shown, in accordance with an embodiment. In an embodiment, the magnetic coupler 220 may comprise a bushing 240. The bushing 240 may be a stationary component in the semiconductor processing tool 100. For example, the bushing 240 may be bolted or otherwise coupled to the chamber (not shown) and the rotary electrical feedthrough (not shown). O-rings 245 and 246 may be provided at the interface with other components. The O-rings 245 provide a seal in order to maintain a vacuum pressure within the bushing 240 relative to an external atmospheric pressure.

In an embodiment, the bushing 240 may comprise a conductive material, such as a metal. The conductive material may be used as part of the electrical path of the RF return path 101 described in greater detail above. Particularly, the RF return path 101 may follow an inside surface of the bushing 240. Additionally, since magnetic forces are used to enable the rotation of the system, the bushing 240 is a non-magnetic conductor. For example, the bushing 240 may comprise aluminum or the like.

In an embodiment, a tube 241 may be provided inside the bushing 240. The tube 241 may be the enclosure around the utilities (not shown) that pass through the magnetic coupler 220. The interior of the tube 241 may be configured to be held at vacuum pressures in some embodiments. In an embodiment, the tube 241 may be mechanically coupled to one or more first magnets 243. The first magnets 243 may be provided inside of the bushing 240. In a particular embodiment, six or more first magnets 243 are provided axially around the interior of the bushing 240. The first magnets 243 may be mechanically coupled to the tube 241 so that movement of the first magnets 243 results in movement of the tube 241.

In an embodiment, the tube 241 may interface with the bushing 240 via bearings 247. The bearings 247 may be provided above and/or under the first magnets 243. The bearings 247 allow for smooth motion of the tube 241 relative to the bushing 240. In a particular embodiment, the bearings 247 are electrically insulating bearings 247. Making the bearings 247 electrically insulating aids in the efficiency of the RF return path 101 that passes along the interior surface of the bushing 240. If the bearings 247 are conductive, the RF return path 101 may be degraded since the bearings 247 directly contact the RF return path 101. For example, non-conductive bearings 247 may include ceramic bearings or the like. In an embodiment, the bearings 247 may be configured to be used in a vacuum environment.

In an embodiment, an outer housing 242 may be provided around the bushing 240. The outer housing 242 may be rotatable around the bushing 240. For example, bearings 248 may be provided between the outer housing 242 and the bushing 240. In an embodiment, the bearings 248 may be any type of bearing. Particularly, since the bearings 248 do not contact the interior surface of the bushing 240, there is no concern with conductive bearings 248 interfering with the RF return path 101. Additionally, the bearings 248 are provided in atmospheric conditions, as opposed to vacuum conditions to which the bearings 247 are exposed.

In an embodiment, a plurality of second magnets 244 are provided between the outer housing 242 and the bushing 240. The number of second magnets 244 may match the number of first magnets 243. Particularly, each first magnet 243 may be magnetically coupled to different ones of the second magnets 244. The second magnets 244 may also be mechanically coupled to the outer housing 242. As such, as the outer housing 242 rotates, the second magnets 244 will also rotate. Additionally, rotation of the second magnets 244 will result in the rotation of the first magnets 243 and the tube 241. In some embodiments, the tube 241 may be mechanically coupled to the chuck 105 and the rotating component (e.g., rotor) of the rotary electrical feedthrough 130. Accordingly, rotation of the outer housing 242 results in the desired rotation of the system. In an embodiment, the outer housing 242 may be coupled to an actuator or the like (not shown). The actuator may be used to enable rotation of the outer housing 242.

Figure 3A:
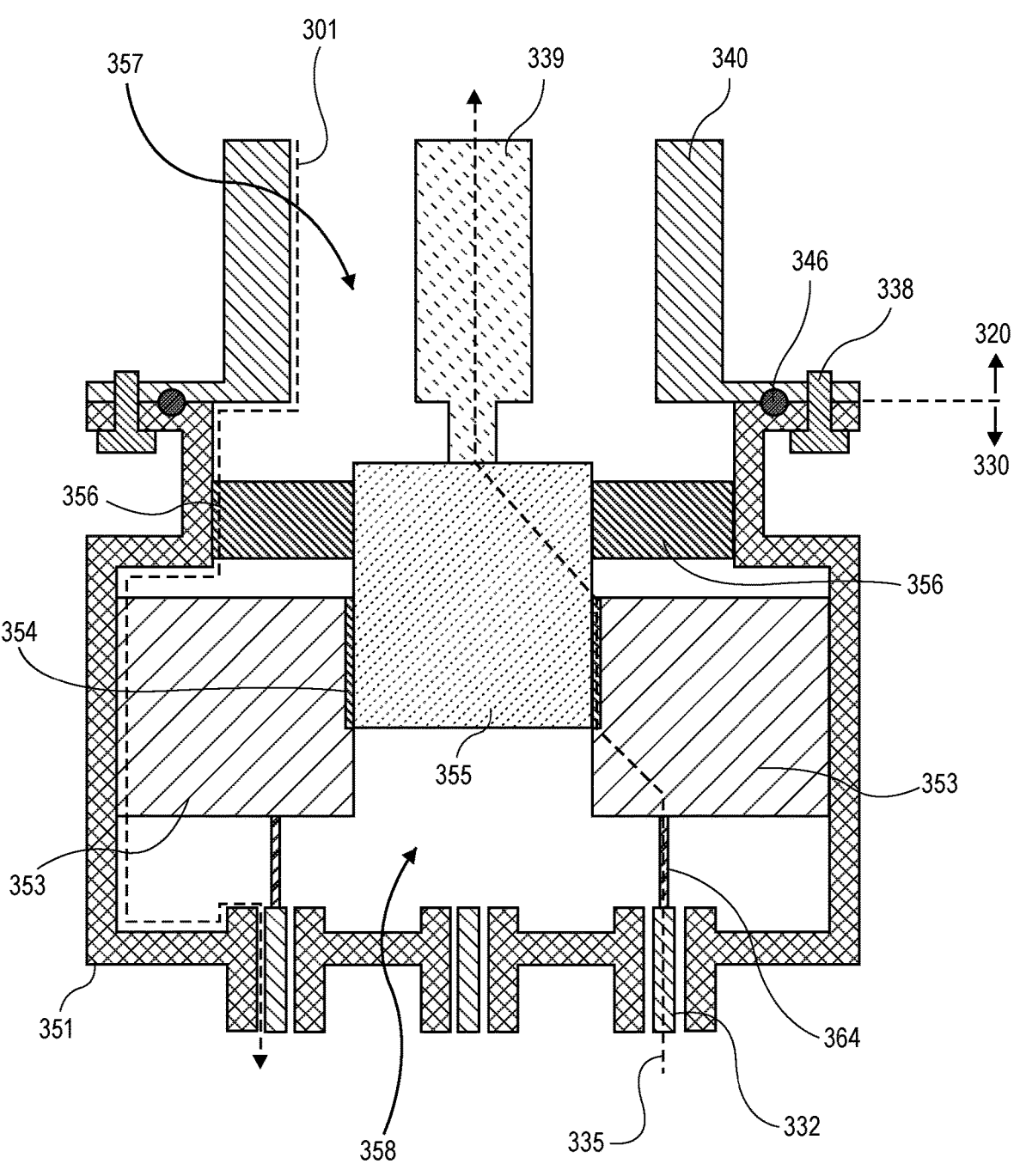
FIG. 3A is a cross-sectional illustration of a rotary electrical feedthrough, in accordance with an embodiment.

Referring now to FIG. 3A, a cross-sectional illustration of the rotary electrical feedthrough 330 is shown, in accordance with an embodiment. Additionally, a lower portion of the bushing 340 of the magnetic coupler 320 is shown for context. The bottom of the bushing 340 may be coupled to the stationary outer housing 351 (sometimes referred to as a stator housing 351). O-rings 346 or other gasket materials may be used to provide a vacuum seal between the bushing 340 and the stator housing 351. Bolts 338 or other fasteners may secure the bushing 340 to the stator housing 351.

In an embodiment, the stator housing 351 may comprise feedthroughs or inputs 332. The inputs 332 may be hermetically sealed so that a vacuum may be maintained in the internal volume 358 of the stator housing 351. The inputs 332 may be suitable for any type of power or signal (e.g., RF, AC, and/or DC). In a particular embodiment, the inputs 332 may comprise HN connectors or the like. The inputs 332 allow for signals 335 to pass from outside the vacuum environment to inside the vacuum in the internal volume 358 of the rotary electrical feedthrough 330. In some embodiments, a plurality of inputs 332 are provided. For example, up to seven or more electrical inputs 332 may be provided in some embodiments.

In an embodiment, a bridge 364 may connect the input 332 to an electrical transfer assembly 353. The electrical transfer assembly 353 allows for a stationary input 332 to be freely rotated. The electrical transfer assembly 353 may include any architecture suitable for providing rotational functionality to a static input 332. For example, the electrical transfer assembly 353 may be a slip-ring, a brush, a liquid metal interconnect, or a roll ring architecture. Output 354 may be directly coupled to a rotor 355.

The rotor 355 may be mechanically coupled to a connector 339 that extends into the magnetic coupler 320. For example, the connector 339 may be coupled to the internal tube 241 that is rotated. That is, rotation in the magnetic coupler 320 may be transmitted to the rotary electrical feedthrough 330 through the connector 339. In an embodiment, the rotor 355 may be coupled to the stator housing 351 by bearings 356 that allow for free rotation of the rotor 355 inside of the stator housing 351.

As noted above, the interior 357 of the magnetic coupler 320 and the internal volume 358 may be maintained at a vacuum pressure. In some embodiments, the interior 357 of the magnetic coupler 320 may be fluidically coupled to the internal volume 358 so that the two are maintained at substantially the same pressure. In other embodiments (described in greater detail below) there may be a pressure difference between the interior 357 of the magnetic coupler 320 and the internal volume 358.

The illustrated embodiment also shows the path of the RF return path 301. As shown, the RF return path 301 is provided along an internal surface of the bushing 340 and continues on the internal surface of the stator housing 351. The RF return path 301 may follow the interior of the stator housing 351 until reaching one of the inputs 332. The RF ground path 301 is then propagated out of the vacuum environment, and can be connected back to the RF match/power supply (not shown) in order to complete the RF circuit to enable closed loop control of the plasma.

Figure 3B:
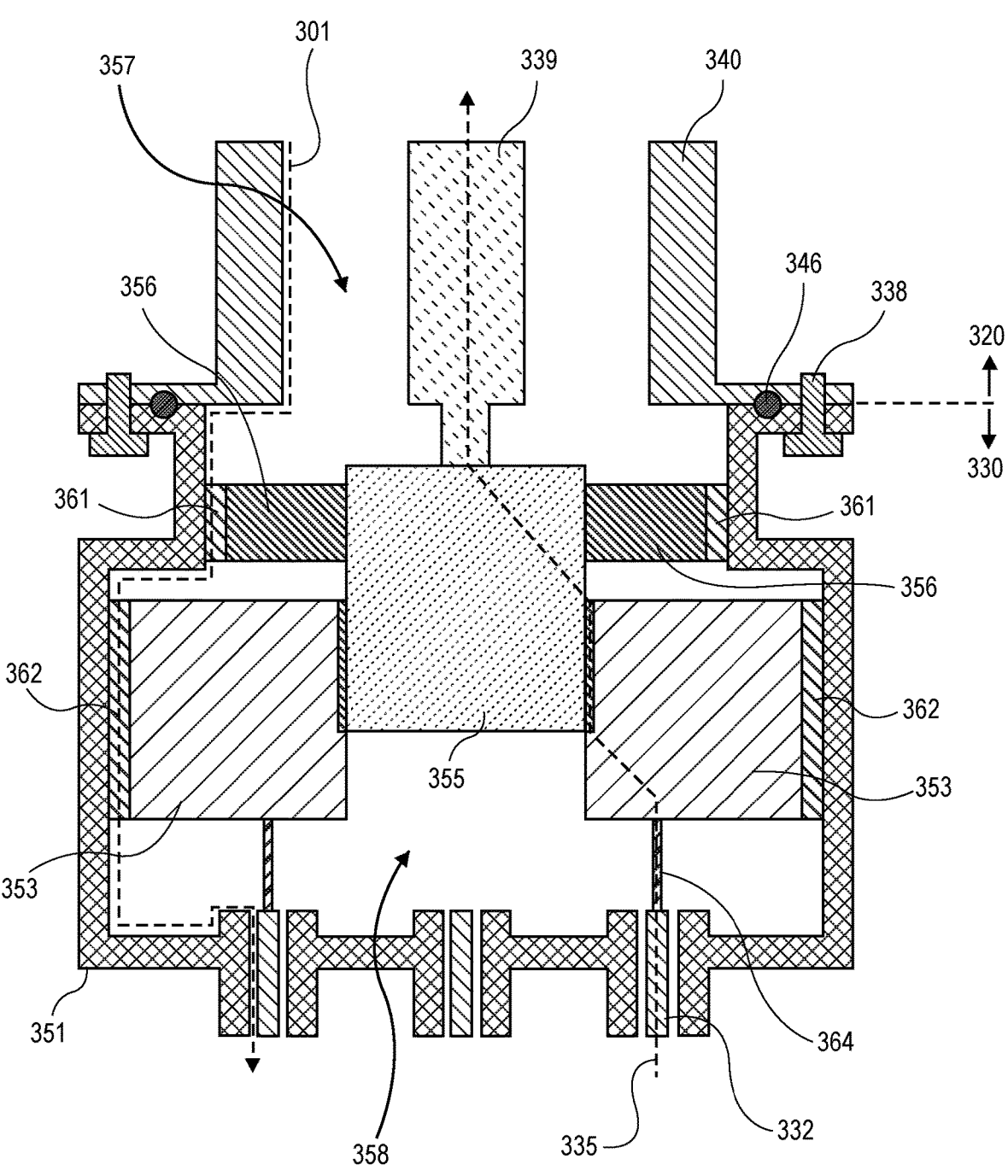
FIG. 3B is a cross-sectional illustration of a rotary electrical feedthrough with enhanced electrical shielding to enable a proper RF return line, in accordance with an embodiment.

Referring now to FIG. 3B, a cross-sectional illustration of a rotary electrical feedthrough 330 is shown, in accordance with an additional embodiment. In an embodiment, the rotary electrical feedthrough 330 in FIG. 3B may be substantially similar to the rotary electrical feedthrough 330 in FIG. 3A, with the exception of the RF return path 301. As noted above, the presence of conductive features along the RF return path 301 can degrade the effectiveness of the return path. As such, care is taken to avoid the presence of conductive material along the return path 301.

For example, the bearings 356 may be separated from the interior surface of the stator housing 351 by an insulating liner 361. The insulator liner 361 may be any electrically insulative material, such as plastics, rubber, or the like. When the insulating liner 361 is present, the bearings 356 may be any type of bearings 356, including electrically conductive bearings 356. In some embodiments, the insulating liner 361 may be an integrated part with the bearings 356 or the insulating liner 361 is a discrete component between the bearings 356 and the stator housing 351. In yet another embodiment, the bearings 356 may be insulative bearings 356, such as ceramic bearings 356. In such an embodiment, a discrete insulating liner 361 may not be necessary.

Additionally, in some instances, the surface of the electrical transfer assembly 353 may be conductive. In such embodiments, an insulating liner 362 may be provided between the electrical transfer assembly 353 and the stator housing 351. When both the bearings 356 and the electrical transfer assembly 353 are electrically isolated from the stator housing 351, the RF return path 301 is improved.

Figure 3C:
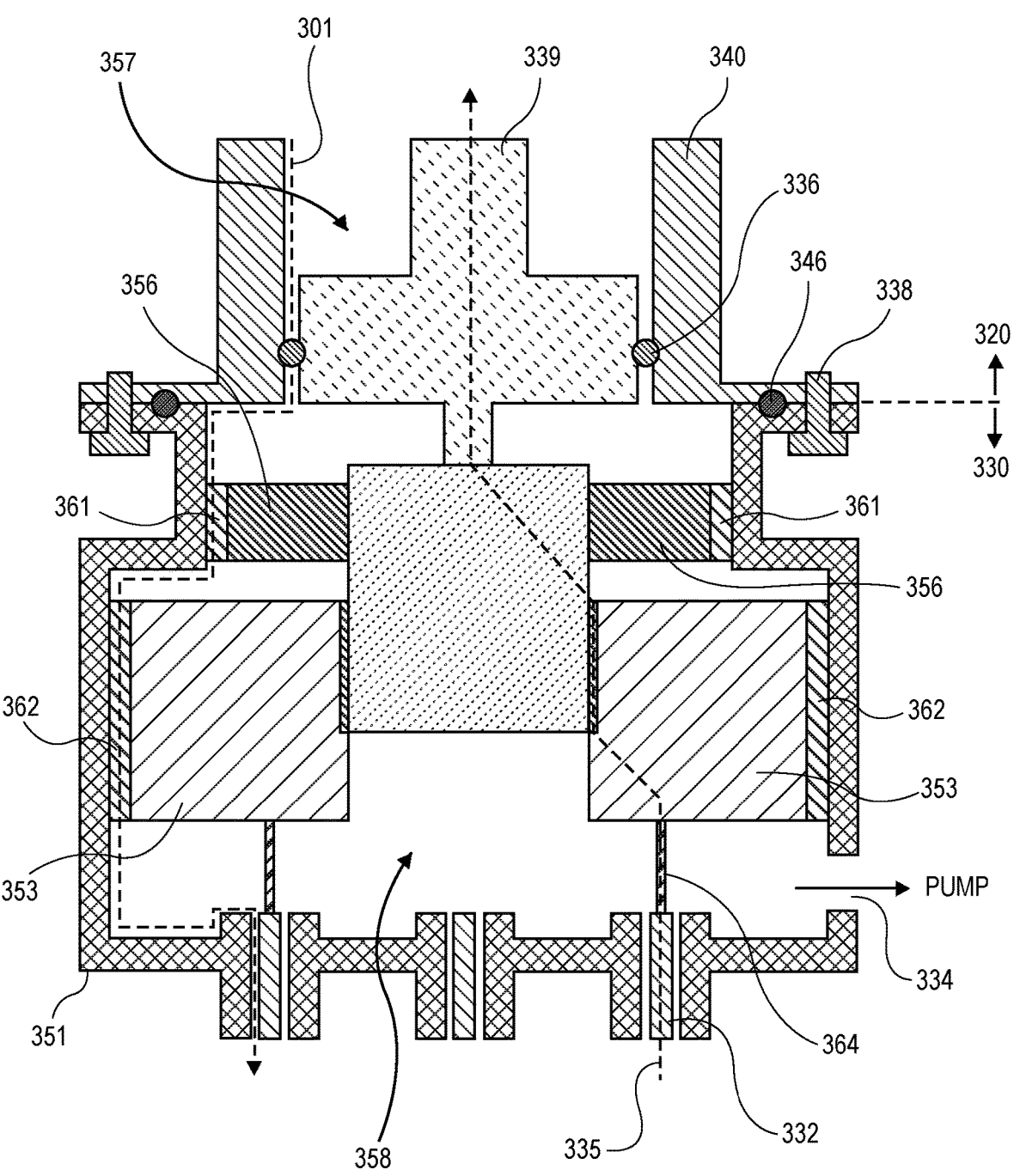
FIG. 3C is a cross-sectional illustration of a rotary electrical feedthrough with a discrete volume that can be pumped to a desired vacuum level, in accordance with an embodiment.

Referring now to FIG. 3C, a cross-section of a rotary electrical feedthrough 330 is shown, in accordance with an additional embodiment. In an embodiment, the rotary electrical feedthrough 330 in FIG. 3C may be substantially similar to the rotary electrical feedthrough 330 in FIG. 3B, with the exception of the interface between the rotary electrical feedthrough 330 and the magnetic coupler 320.

Instead of the two components being fluidically coupled with each other, the interior 357 of the magnetic coupler 320 may be separated from the interior volume 358 of the rotary electrical feedthrough 330. For example, an O-ring 336 or the like may be provided between the connector 339 and the bushing 340. In a particular embodiment, the O-ring 336 is a dynamic seal that allows for the connector 339 to be rotated.

Separating the two volumes 357 and 358 allows for the volume 358 to be held at a pressure that is different than the pressure of the volume 357. For example, the pressure in the internal volume 358 may be lower than the pressure of the volume 357. For example, the pressure in the volume 357 may be $1e^{-6}$ Torr and the pressure in the internal volume 358 may be $1e^{-9}$ Torr. In a particular embodiment, a dedicated pump (not shown) may be coupled to an opening 334 in the stator housing 351. Decreasing the pressure in the stator housing 351 pushes the location of the Paschen curve further to the left. This reduces the risk of igniting a plasma within the stator housing 351. Additionally, it is to be appreciated that the pressure difference at the interface between the volume 357 and the internal volume 358 is not significantly high. This allows for a dynamic seal 336 to effectively function. That is, the dynamic seal 336 does not need to support the difference between the vacuum pressure and atmospheric pressure.

Figure 4:
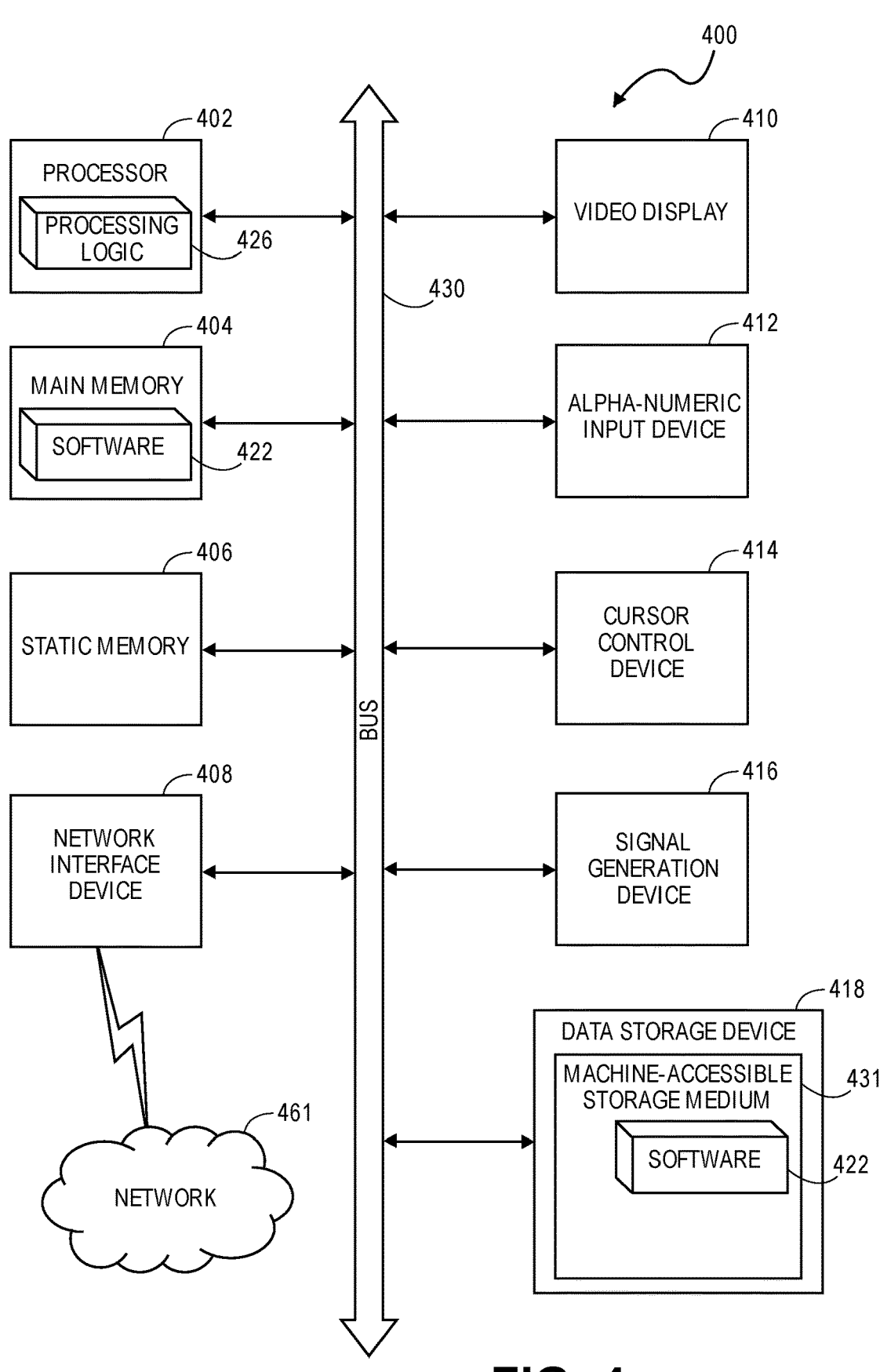
FIG. 4 illustrates a block diagram of an exemplary computer system that may be used in conjunction with a processing tool, in accordance with an embodiment.

Referring now to FIG. 4, a block diagram of an exemplary computer system 400 of a processing tool is illustrated in accordance with an embodiment. In an embodiment, computer system 400 is coupled to and controls processing in the processing tool. Computer system 400 may be connected (e.g., networked) to other machines in a Local Area Network (LAN), an intranet, an extranet, or the Internet. Computer system 400 may operate in the capacity of a server or a client machine in a client-server network environment, or as a peer machine in a peer-to-peer (or distributed) network environment. Computer system 400 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 400, the term "machine" shall also be taken to include any collection of machines (e.g., computers) that individually or jointly execute a set (or multiple sets) of instructions to perform any one or more of the methodologies described herein.

Computer system 400 may include a computer program product, or software 422, having a non-transitory machine-readable medium having stored thereon instructions, which may be used to program computer system 400 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 400 includes a system processor 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a secondary memory 418 (e.g., a data storage device), which communicate with each other via a bus 430.

System processor 402 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 402 may also be one or more special-purpose processing devices such as an application specific integrated circuit (ASIC), a field programmable gate array (FPGA), a digital signal system processor (DSP), network system processor, or the like. System processor 402 is configured to execute the processing logic 426 for performing the operations described herein.

The computer system 400 may further include a system network interface device 408 for communicating with other devices or machines. The computer system 400 may also include a video display unit 410 (e.g., a liquid crystal display (LCD), a light emitting diode display (LED), or a cathode ray tube (CRT)), an alphanumeric input device 412 (e.g., a keyboard), a cursor control device 414 (e.g., a mouse), and a signal generation device 416 (e.g., a speaker).

The secondary memory 418 may include a machine-accessible storage medium 432 (or more specifically a computer-readable storage medium) on which is stored one or more sets of instructions (e.g., software 422) embodying any one or more of the methodologies or functions described herein. The software 422 may also reside, completely or at least partially, within the main memory 404 and/or within the system processor 402 during execution thereof by the computer system 400, the main memory 404 and the system processor 402 also constituting machine-readable storage media. The software 422 may further be transmitted or received over a network 420 via the system network interface device 408. In an embodiment, the network interface device 408 may operate using RF coupling, optical coupling, acoustic coupling, or inductive coupling.

While the machine-accessible storage medium 432 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:
1. A semiconductor processing tool, comprising:
a chamber;

a chuck within the chamber, wherein the chuck is configured to rotate;

a pedestal holder around the chuck; and a utility column coupled to the chuck, wherein the utility column comprises:

a magnetic coupler to enable rotation of portions of the utility column and the chuck, wherein the magnetic coupler comprises a bushing, wherein the bushing is stationary, a first set of magnets outside of the bushing, a second set of magnets inside of the bushing, and a tube coupled to the second set of magnets; and a rotary electrical feedthrough, wherein the rotary electrical feedthrough, comprises a stator housing, and a rotor, and wherein an RF return path is provided along the pedestal holder, the bushing, and the stator housing.

2. The semiconductor processing tool of claim 1, wherein the RF return path is electrically isolated from conductive components other than the pedestal holder, the bushing, and the stator housing, and wherein an outer race of a mechanical bearing inside of the bushing is electrically isolated from the RF return path.

3. The semiconductor processing tool of claim 1, wherein the interior of the tube and the rotary electrical feedthrough are sealed in order to enable a chamber vacuum pressure to be maintained in the tube and the rotary electrical feedthrough.

4. The semiconductor processing tool of claim 1, wherein a dynamic seal fluidically isolates the rotary electrical feedthrough and an interior of the tube from the exterior of the tube, and wherein the rotary electrical feedthrough and the interior of the tube are configured to be held at a pressure that is different than the pressure in a wafer cavity and a process cavity in the chamber.

5. The semiconductor processing tool of claim 1, wherein the semiconductor processing tool is a physical vapor deposition (PVD) tool.

6. The semiconductor processing tool of claim 1, wherein the rotary electrical feedthrough comprises up to seven electrical inputs.

7. The semiconductor processing tool of claim 6, wherein the electrical inputs are provided for one or more heaters and one or more chucking electrodes.

8. The semiconductor processing tool of claim 1, further comprising:

a backside gas line for a substrate on the chuck, wherein the backside gas line is at an axial center of the utility column, and wherein a dynamic seal is provided around the backside gas line at a bottom of the rotary electrical feedthrough, and wherein a backside gas thermally couples the substrate to the chuck.

\* \* \* \* \*